US012804944B2

(12) United States Patent
Tanaka et al.

(10) Patent No.: US 12,804,944 B2
(45) Date of Patent: Nov. 17, 2026

(54) SEMICONDUCTOR DEVICE WITH A FIELD PLATE LOCATED IN AN INTER-LAYER INSULATING FILM

(71) Applicants: Kabushiki Kaisha Toshiba, Tokyo (JP); Toshiba Electronic Devices & Storage Corporation, Tokyo (JP)

(72) Inventors: Katsuhisa Tanaka, Himeji Hyogo (JP); Hiroshi Kono, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 560 days.

(21) Appl. No.: 18/456,071

(22) Filed: Aug. 25, 2023

(65) Prior Publication Data

US 2024/0313108 A1 Sep. 19, 2024

(30) Foreign Application Priority Data

Mar. 17, 2023 (JP) ................................ 2023-043325

(51) Int. Cl.

| | |
|---|---|
| ***H10D 30/66*** | (2025.01) |
| ***H10D 12/01*** | (2025.01) |
| ***H10D 62/10*** | (2025.01) |
| ***H10D 62/832*** | (2025.01) |
| ***H10D 64/00*** | (2025.01) |
| ***H10P 30/20*** | (2026.01) |

(52) U.S. Cl.

CPC ......... *H10D 30/665* (2025.01); *H10D 12/031* (2025.01); *H10D 30/668* (2025.01); *H10D 62/106* (2025.01); *H10D 62/109* (2025.01); *H10D 62/112* (2025.01); *H10D 62/8325* (2025.01); *H10D 64/111* (2025.01); *H10P 30/2042* (2026.01); *H10P 30/21* (2026.01)

(58) Field of Classification Search

CPC .................................................... H10D 30/665
USPC ........................................................... 257/77
See application file for complete search history.

(56) References Cited

U.S. PATENT DOCUMENTS 8,809,969 B2 8/2014 Tarui et al.
9,196,488 B2 11/2015 Takahashi
(Continued)

FOREIGN PATENT DOCUMENTS

JP 2010-267655 A 11/2010
JP 2013-135062 A 7/2013
(Continued)

OTHER PUBLICATIONS

Notice of Reasons for Refusal mailed Feb. 16, 2026, in corresponding Japanese Patent Application No. 2023-043325, with English machine translation, 12 pages.

*Primary Examiner* — Ajay Arora
(74) *Attorney, Agent, or Firm* — Kim & Stewart LLP

(57) ABSTRACT

A silicon carbide layer includes a first surface, a second surface, a third surface positioned at a side opposite to the first and second surfaces in a first direction, and a side surface. The second surface is at a position recessed further toward the third surface side than the first surface. An inter-layer insulating film is located on the second surface. A thickness of the inter-layer insulating film is greater than a difference in heights in the first direction between the first surface and the second surface. A field plate is located in the inter-layer insulating film. The field plate has a lower resistivity than the inter-layer insulating film.

17 Claims, 14 Drawing Sheets

(56) References Cited

U.S. PATENT DOCUMENTS

| | | | | |
|---|---|---|---|---|
| 9,349,811 | B2 | 5/2016 | Takahashi | |
| 9,871,109 | B2 | 1/2018 | Kamibaba et al. | |
| 10,396,071 | B2 | 8/2019 | Sato | |
| 10,896,961 | B2 | 1/2021 | Ozaki et al. | |
| 11,424,126 | B2 | 8/2022 | Kamimura et al. | |
| 2014/0077261 | A1 | 3/2014 | Oshino et al. | |
| 2016/0035840 | A1 * | 2/2016 | Matsudai | H10D 62/115 257/330 |
| 2017/0301788 | A1 * | 10/2017 | Fukui | H10D 30/665 |
| 2021/0091220 | A1 | 3/2021 | Sugawara et al. | |
| 2021/0167167 | A1 | 6/2021 | Kawada | |
| 2022/0077312 | A1 | 3/2022 | Hoshi | |
| 2022/0190105 | A1 * | 6/2022 | Kim | H10D 62/8325 |
| 2022/0199786 | A1 | 6/2022 | Tokumitsu et al. | |
| 2022/0320268 | A1 | 10/2022 | Moriya | |
| 2023/0062475 | A1 | 3/2023 | Kumada | |

FOREIGN PATENT DOCUMENTS

| | | | |
|---|---|---|---|
| JP | 2014078689 | A | 5/2014 |
| JP | 2014-204038 | A | 10/2014 |
| JP | 2015-076544 | A | 4/2015 |
| JP | 2021048276 | A | 3/2021 |
| JP | 2021089916 | A | 6/2021 |
| JP | 2022-000882 | A | 1/2022 |
| JP | 2022-003711 | A | 1/2022 |
| JP | 2022-010152 | A | 1/2022 |
| JP | 2022-044997 | A | 3/2022 |
| JP | 2022-099426 | A | 7/2022 |
| JP | 2023-032722 | A | 3/2023 |
| WO | 2016047438 | A1 | 3/2016 |
| WO | 2018/139027 | A1 | 8/2018 |

* cited by examiner

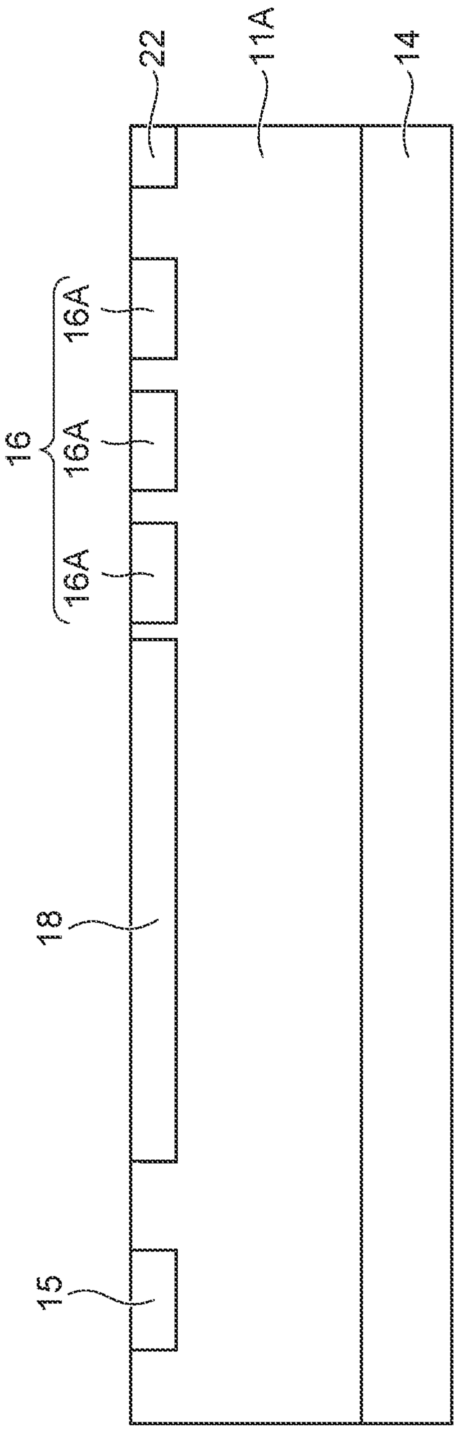
FIG. 5
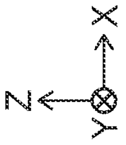

SEMICONDUCTOR DEVICE WITH A FIELD PLATE LOCATED IN AN INTER-LAYER INSULATING FILM

CROSS-REFERENCE TO RELATED APPLICATION

This application is based upon and claims the benefit of priority from Japanese Patent Application No. 2023-043325, filed on Mar. 17, 2023, the entire contents of which are incorporated herein by reference.

FIELD

Embodiments described herein relate generally to a semiconductor device.

BACKGROUND

Power devices that use silicon carbide (SIC) are being developed. SiC devices need a different development approach from silicon devices.

BRIEF DESCRIPTION OF THE DRAWINGS

FIG. 4 to FIG. 14 are schematic cross-sectional views showing a method for manufacturing the semiconductor device of the embodiment.

DETAILED DESCRIPTION

Figure 1:
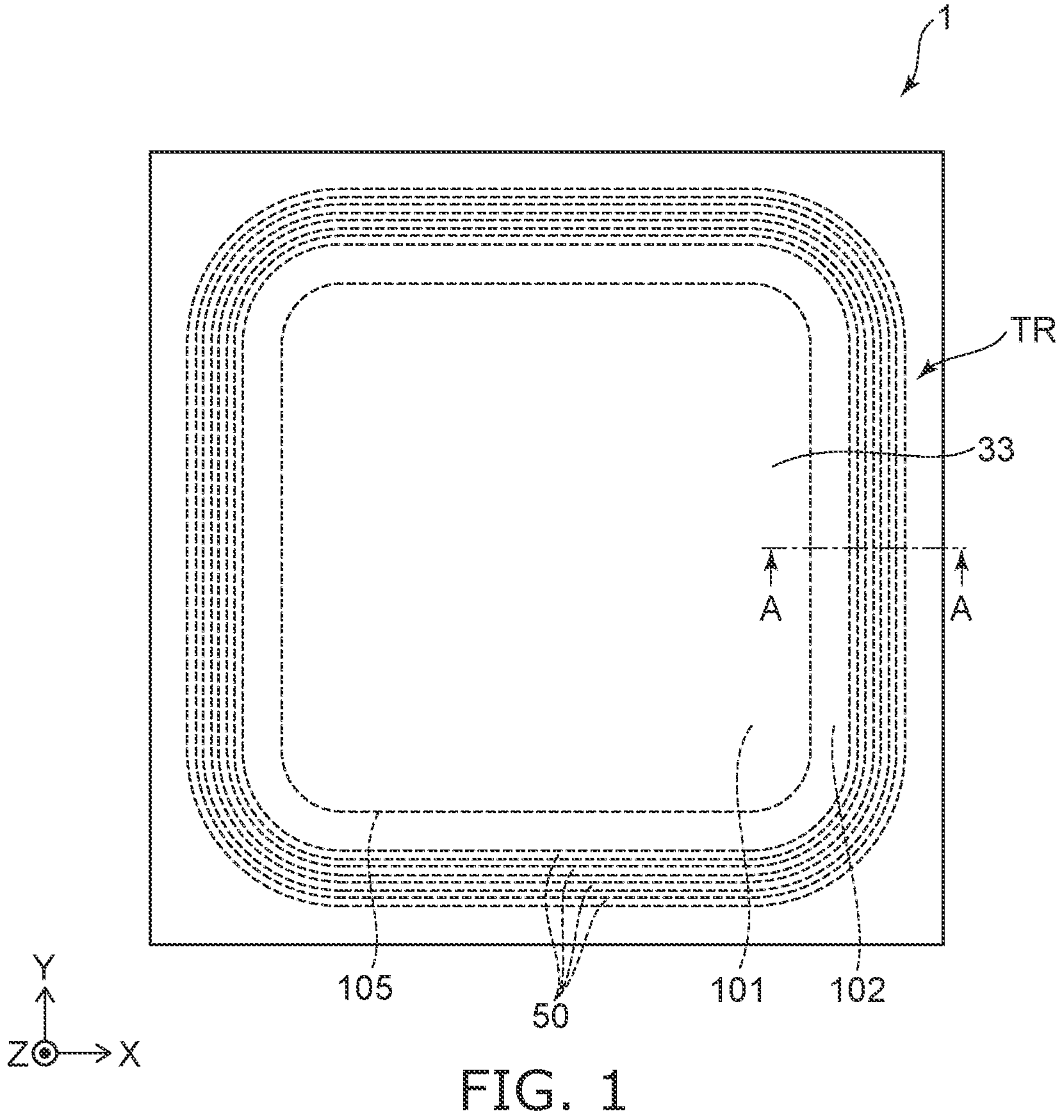
FIG. 1 is a schematic plan view of a semiconductor device of an embodiment.

According to one embodiment, a semiconductor device includes a silicon carbide layer including a first surface, a second surface, a third surface positioned at a side opposite to the first and second surfaces in a first direction, and a side surface, the second surface being positioned between the first surface and the side surface in a direction orthogonal to the first direction, the second surface being at a position recessed further toward the third surface side than the first surface; a first electrode located at the first surface; a second electrode located at the third surface; a gate electrode located in the silicon carbide layer between the first surface and the third surface; a gate insulating film located between the gate electrode and the silicon carbide layer; an inter-layer insulating film located on the second surface, a thickness of the inter-layer insulating film being greater than a difference in heights in the first direction between the first surface and the second surface; and a field plate located in the inter-layer insulating film, the field plate having a lower resistivity than the inter-layer insulating film.

Exemplary embodiments will now be described with reference to the drawings. Similar components in the drawings are marked with like reference numerals. In the description of embodiments described below, a first conductivity type is an n-type, and a second conductivity type is a p-type; however, the first conductivity type may be the p-type, and the second conductivity type may be the n-type.

Figure 2:
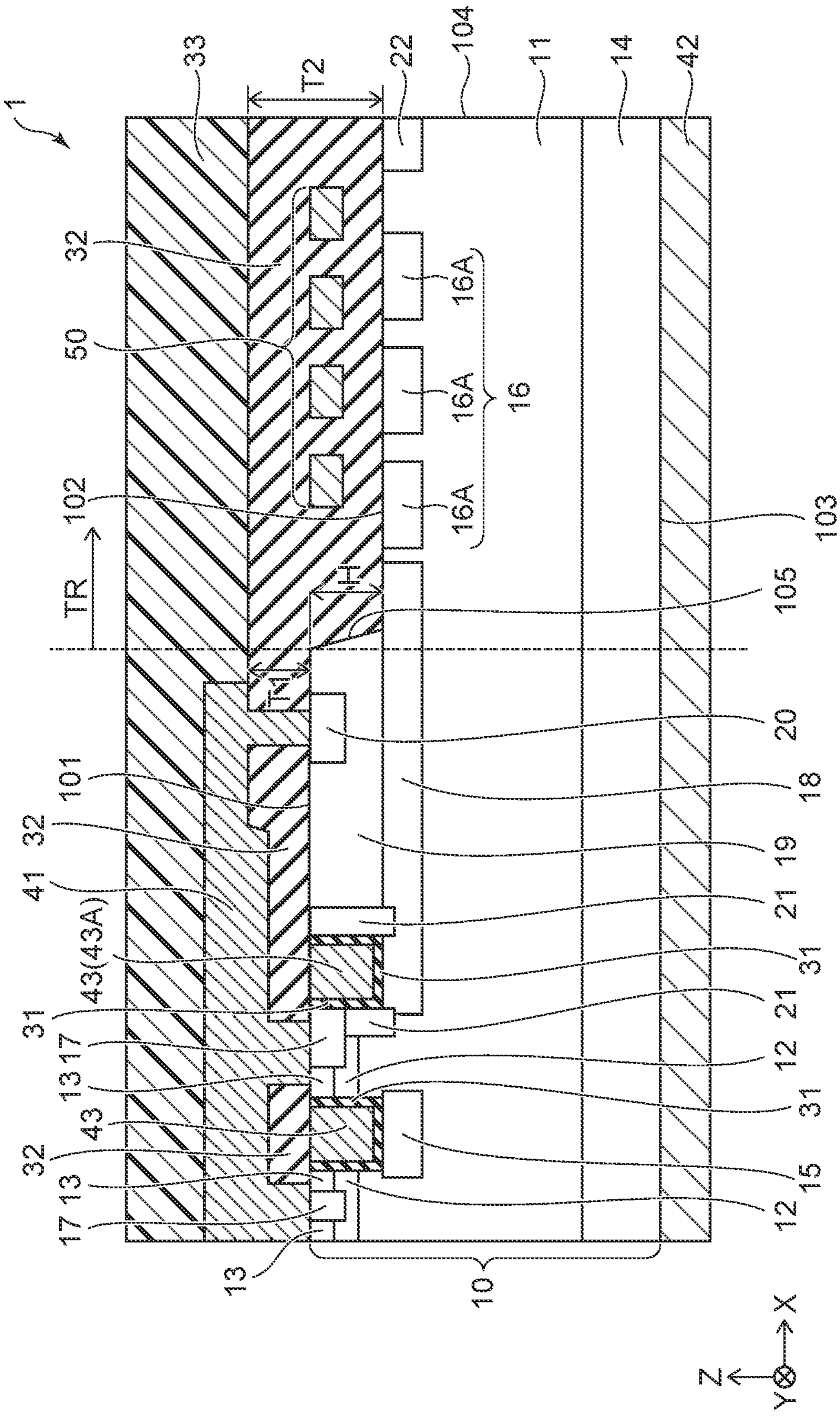
FIG. 2 is an A-A cross-sectional view of FIG. 1.

As shown in FIG. 2, a semiconductor device 1 of the embodiment includes a silicon carbide layer 10. The silicon carbide layer 10 includes a first surface 101, a second surface 102, a third surface 103, and a side surface 104. The third surface 103 is positioned at the side opposite to the first and second surfaces 101 and 102 in a first direction Z. The first direction Z is a direction connecting the first surface 101 and the third surface 103 with the shortest distance, or a direction connecting the second surface 102 and the third surface 103 with the shortest distance. Two directions orthogonal to the first direction Z are taken as a second direction X and a third direction Y. The second direction X and the third direction Y are orthogonal to each other.

The second surface 102 is positioned between the first surface 101 and the side surface 104 in a direction orthogonal to the first direction Z, and is at a position recessed further toward the third surface 103 side than the first surface 101. In other words, a step is formed between the first surface 101 and the second surface 102. The step between the first surface 101 and the second surface 102 is labeled “H” in FIG. 2. A step H also can be referred to as the height difference in the first direction Z between the first surface 101 and the second surface 102.

As shown in FIG. 1, the second surface 102 continuously surrounds the first surface 101 when viewed in plan. In the specification, the region where the second surface 102 is located is called a termination region TR of the semiconductor device 1. The silicon carbide layer 10 is inward of the termination region TR and is formed in a mesa shape.

The semiconductor device 1 further includes a first electrode 41 located at the first surface 101, and a second electrode 42 located at the third surface 103. For example, a metal such as aluminum or the like can be used as the material of the first electrode 41. For example, a metal such as nickel silicide, titanium, nickel, gold, etc., can be used as the material of the second electrode 42.

The semiconductor device 1 further includes a gate electrode 43 and a gate insulating film 31. The gate electrode 43 has a so-called trench gate structure located in the silicon carbide layer 10 between the first surface 101 and the third surface 103. The gate electrode 43 extends in the third direction Y. Multiple gate electrodes 43 are arranged in the second direction X. For example, polycrystalline silicon can be used as the material of the gate electrode 43.

The gate insulating film 31 is located between the gate electrode 43 and the silicon carbide layer 10. For example, a silicon oxide film can be used as the gate insulating film 31.

The semiconductor device 1 further includes an inter-layer insulating film 32 located on the second surface 102. A thickness T2 of the inter-layer insulating film 32 on the second surface 102 is greater than a thickness T1 of the inter-layer insulating film 32 on the first surface 101. The thicknesses T1 and T2 each represent maximum thicknesses in the first direction Z. The thickness T2 of the inter-layer insulating film 32 on the second surface 102 is greater than the height difference H in the first direction Z between the first surface 101 and the second surface 102. The upper surface of the inter-layer insulating film 32 is at a higher position in the first direction Z than the position of the first surface 101. The inter-layer insulating film 32 also is located between the first surface 101 and the first electrode 41. The inter-layer insulating film 32 also is located between the first electrode 41 and the upper surface of the gate insulating film 31. The inter-layer insulating film 32 covers an interface 105 between the first surface 101 and the second surface 102. For example, a silicon oxide film can be used as the inter-layer insulating film 32.

The semiconductor device 1 further includes a field plate 50 located in the inter-layer insulating film 32 on the second surface 102. The inter-layer insulating film 32 covers an upper surface, lower surface, and side surface of the field plate 50.

As shown in FIG. 1, the field plates 50 are formed in multiple ring shapes when viewed in plan, and continuously surround the first surface 101.

The resistivity of the field plate 50 is less than the resistivity of the inter-layer insulating film 32. For example, polycrystalline silicon can be used as the material of the field plate 50. For example, the field plate 50 is electrically floating. In such a case, the potential of the field plate 50 is set to a potential between the potential of the first electrode 41 and the potential of the second electrode 42 in a state in which a voltage is applied to the first and second electrodes 41 and 42. The field plate 50 may be electrically connected with the first electrode 41.

The semiconductor device 1 can further include an insulating protective film 33. The protective film 33 covers the first electrode 41 and the inter-layer insulating film 32. For example, a resin such as polyimide or the like can be used as the protective film 33.

The silicon carbide layer includes an n-type first layer 11, a p-type second layer 12, and an n-type third layer 13. For example, the semiconductor device 1 has a MOSFET (Metal-Oxide-Semiconductor Field Effect Transistor) or IGBT (Insulated Gate Bipolar Transistor) structure. The first layer 11 functions as a drift layer of a MOSFET or an IGBT. The second layer 12 functions as a base layer of the MOSFET or IGBT. The third layer 13 functions as a source layer of the MOSFET, or an emitter layer of the IGBT.

The first layer 11 is provided continuously between the first surface 101 and the third surface 103 and between the second surface 102 and the third surface 103. The second layer 12 is located on the first layer 11 and faces the side surface of the gate electrode 43 via the gate insulating film 31. The third layer 13 is located on the second layer 12 and is electrically connected with the first electrode 41. The n-type impurity concentration of the third layer 13 is greater than the n-type impurity concentration of the first layer 11.

The silicon carbide layer 10 further includes a fourth layer 14 located between the first layer 11 and the second electrode 42. The fourth layer 14 is electrically connected with the second electrode 42. In a MOSFET, the fourth layer 14 functions as an n-type drain layer. In such a case, the n-type impurity concentration of the fourth layer 14 is greater than the n-type impurity concentration of the first layer 11. In an IGBT, the fourth layer 14 functions as a p-type collector layer. In such a case, the p-type impurity concentration of the fourth layer 14 is greater than the p-type impurity concentration of the second layer 12.

The silicon carbide layer 10 further includes a p-type seventh layer 17 that is located on the second layer 12 and contacts the first electrode 41. The p-type impurity concentration of the seventh layer 17 is greater than the p-type impurity concentration of the second layer 12. The second layer 12 is electrically connected with the first electrode 41 via the seventh layer 17.

In the on-operation of the semiconductor device 1, a potential that is not less than a threshold is applied to the gate electrode 43; and an inversion layer (an n-type channel) is formed in the region of the second layer 12 facing the side surface of the gate electrode 43. A potential that is lower than that of the second electrode 42 is applied to the first electrode 41; and a potential that is higher than that of the first electrode 41 is applied to the second electrode 42. A current flows between the first electrode 41 and the second electrode 42 via the third layer 13, the n-type channel, the first layer 11, and the fourth layer 14 in this state.

When the potential of the gate electrode 43 drops below the threshold, the n-type channel is cut off, and the semiconductor device 1 is switched to the off-state. In the off-state, depletion layers spread through the first layer 11 from the p-n junctions between the n-type first layer 11 (the drift layer) and the p-type layers contacting the first layer 11 in the silicon carbide layer 10; and the breakdown voltage of the semiconductor device 1 is maintained.

In a trench gate structure, the electric field easily concentrates at the bottom portion of the gate electrode 43. Also, because the dielectric breakdown electric field of the $SiO_2$ included in the gate insulating film 31 is less than the dielectric breakdown electric field of silicon carbide (SIC), there is a risk that breakdown of the gate insulating film 31 may occur before breakdown of the SiC. Therefore, according to the embodiment, the silicon carbide layer 10 further includes a p-type fifth layer 15. The fifth layer 15 is positioned under the gate electrode 43 in the first layer 11 and contacts the gate insulating film 31 located at the bottom surface of the gate electrode 43. The fifth layer 15 is electrically connected with the first electrode 41. The p-type impurity concentration of the fifth layer 15 is greater than the p-type impurity concentration of the second layer 12. The fifth layer 15 can relax the electric field concentration at the gate insulating film 31 located at the bottom surface of the gate electrode 43, thereby suppressing breakdown of the gate insulating film 31.

Because the depletion layer also spreads easily in the termination region TR, it is favorable to provide a p-type layer in the termination region TR at a position that is the same height as the fifth layer 15. According to the embodiment, the silicon carbide layer 10 further includes a p-type sixth layer 16. The sixth layer 16 is positioned under the second surface 102 in the first layer 11 and positioned at the same height as the fifth layer 15 in the first direction Z. The same height means that the sixth layer 16 is positioned so that the range in which the fifth layer 15 is formed in the first direction Z would pass through at least a portion of the sixth layer 16 if extended along the second direction X (or the third direction Y). The p-type impurity concentration of the sixth layer 16 is greater than the p-type impurity concentration of the second layer 12. The sixth layer 16 is electrically connected with the first electrode 41.

In the example shown in FIG. 2, the sixth layer 16 includes multiple guard ring layers 16A. The guard ring layer 16A continuously surrounds a region further inward than the second surface 102.

Figure 3:
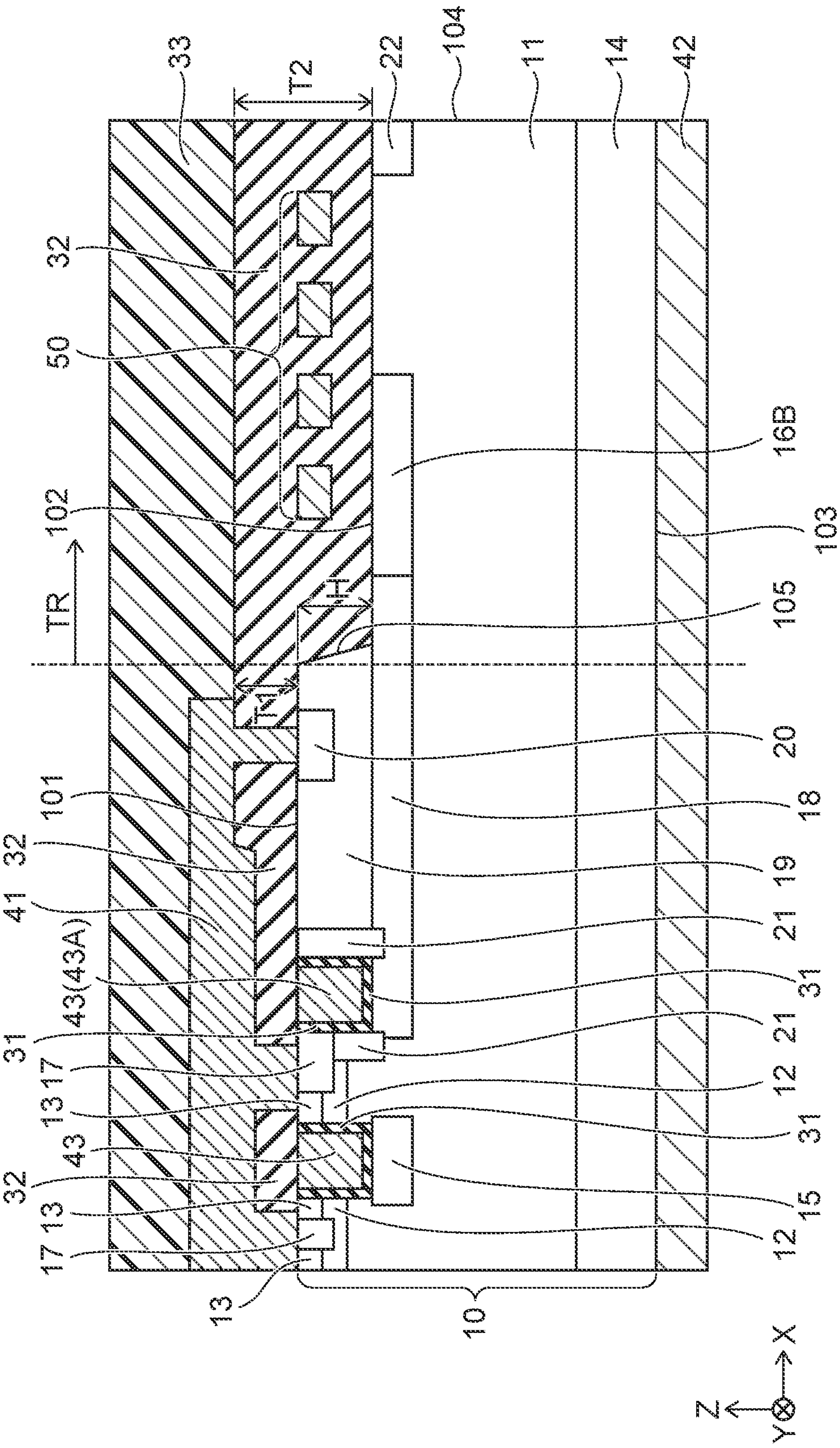
FIG. 3 is a schematic cross-sectional view of a semiconductor device of another example of the embodiment.

A p-type sixth layer 16B shown in FIG. 3 may be located in the termination region TR at a position that is at the same height as the fifth layer 15. For example, the sixth layer 16B is positioned under the second surface 102 in the first layer 11 of the termination region TR and is continuous with a p-type eighth layer 18 described below. The p-type impurity concentration of the sixth layer 16B is greater than the p-type impurity concentration of the second layer 12. The sixth layer 16B is electrically connected with the first electrode 41.

The sixth layer 16B has a so-called RESURF (REduced Surface Field) structure. The sixth layer 16B has a p-type impurity concentration gradient in which the p-type impurity concentration proximate to the side surface 104 is less than the p-type impurity concentration proximate to the gate electrode 43. The p-type impurity concentration of the sixth layer 16B gradually decreases from the eighth layer 18 side toward the side surface 104.

Impurities thermally diffuse less easily in SiC than in Si. Therefore, according to the embodiment, by removing a portion of the upper surface side of the silicon carbide layer 10 as described below, the sixth layer 16 can be distributed in the termination region TR in a range from the same depth as the fifth layer 15 to the second surface 102 which is the surface of the silicon carbide layer 10.

A thick inter-layer insulating film 32 can be formed by forming the inter-layer insulating film 32 to fill the space on the second surface 102 formed by removing the portion of the upper surface side of the silicon carbide layer 10. The thick inter-layer insulating film 32 can suppress the penetration of moisture from the outside and improve the moisture resistance. For example, structural abnormalities such as oxidization of the first electrode 41 due to moisture reacting with the metal of the first electrode 41, alteration of the protective film 33 due to such a structural abnormality, etc., can be suppressed. As a result, the reliability of the semiconductor device 1 can be increased.

Because the thickness of the inter-layer insulating film 32 is increased by utilizing the space on the second surface 102, the height of the entire semiconductor device 1 can be made uniform. The flatness is increased thereby, and the mechanical strength also can be increased.

The field plate 50 also is provided by utilizing the space on the second surface 102. The field plate 50 makes it easier for the depletion layer to spread in the silicon carbide layer 10 of the termination region TR. Local electric field concentration in the termination region TR can be suppressed thereby, and breakdown voltage fluctuation can be suppressed. As a result, the reliability of the semiconductor device 1 can be increased. The field plate 50 makes it easier for the depletion layer to spread even when there is much charge in the inter-layer insulating film 32 and at the interface between the inter-layer insulating film 32 and the second surface 102 and the extension of the depletion layer due to the sixth layer 16 alone is insufficient.

It is favorable for the field plate 50 to be positioned within the range from the second surface 102 to the height of the first surface 101 (within the range of the step H). In other words, in the first direction Z, it is favorable for the position of the upper surface of the field plate 50 to be at a position that is at the same or lower height as the position of the first surface 101. Because such a field plate 50 is proximate to the interface (the second surface 102) between the silicon carbide layer 10 and the inter-layer insulating film 32, the effects of the field plate 50 on the interface can be increased, and the breakdown voltage fluctuation due to effects of the interface charge can be suppressed. Also, because the flatness of the upper surface of the semiconductor device 1 can be better than when the upper surface of the field plate 50 is at a higher position than the height of the first surface 101, process defects can be suppressed, and the mechanical strength can be increased.

It is favorable for the silicon carbide layer 10 to include the p-type eighth layer 18 between the fifth layer 15 and the sixth layer 16 at a position that is at the same height as the fifth and sixth layers 15 and 16. The depletion layer can thereby spread easily in the region between the termination region TR and the region of the silicon carbide layer 10 in which the gate electrode 43 is located (the active region in which the current mainly flows in the on-state); and local electric field concentration can be suppressed. The p-type impurity concentration of the eighth layer 18 is greater than the p-type impurity concentration of the second layer 12.

A p-type ninth layer 19 is located on the eighth layer 18. The upper surface of the ninth layer 19 is included in the first surface 101. A p-type tenth layer 20 is located in the ninth layer 19. The p-type impurity concentration of the ninth layer 19 is less than the p-type impurity concentration of the eighth layer 18 and the p-type impurity concentration of the tenth layer 20. The p-type impurity concentration of the tenth layer 20 is greater than the p-type impurity concentration of the eighth layer 18. The tenth layer 20 contacts the first electrode 41. The ninth layer 19 is electrically connected with the first electrode 41 via the tenth layer 20.

Among the multiple gate electrodes 43, an outermost gate electrode 43A that is positioned most proximate to the termination region TR is a dummy electrode that does not function as a gate electrode causing the current to flow in the path described above in the on-operation. The gate insulating film 31 that is located at the side surface of the outermost gate electrode 43A contacts the p-type seventh layer 17 and a p-type eleventh layer 21. The gate insulating film 31 that is located at the bottom surface of the outermost gate electrode 43A contacts the eighth layer 18. The lower end portion of the eleventh layer 21 contacts the eighth layer 18. The eighth layer 18 is electrically connected with the first electrode 41 via the seventh and eleventh layers 17 and 21. The p-type impurity concentration of the eleventh layer 21 is less than the p-type impurity concentration of the seventh layer 17 and greater than the p-type impurity concentration of the eighth layer 18.

The silicon carbide layer 10 can further include an n-type twelfth layer 22. The twelfth layer 22 is positioned at the corner portion between the second surface 102 and the side surface 104 on the first layer 11 of the termination region TR. The twelfth layer 22 is positioned to be separated from the sixth layer 16 in the second and third directions X and Y and is provided in a ring shape along the outer edge of the semiconductor device 1. The n-type impurity concentration of the twelfth layer 22 is greater than the n-type impurity concentration of the first layer 11. The same potential as the second electrode 42 is applied to the twelfth layer 22. The twelfth layer 22 functions as a field stop layer that suppresses excessive spreading of the depletion layer so that the depletion layer does not reach the side surface 104. The leakage current of the side surface 104 can be suppressed thereby. The twelfth layer 22 is positioned at the same height as the sixth layer 16 in the first direction Z. The depletion layer that spreads from the p-n junction between the sixth layer 16 and the first layer 11 can be easily stopped thereby.

A method for manufacturing the semiconductor device 1 according to the embodiment will now be described with reference to FIGS. 4 to 14.

Figure 4:
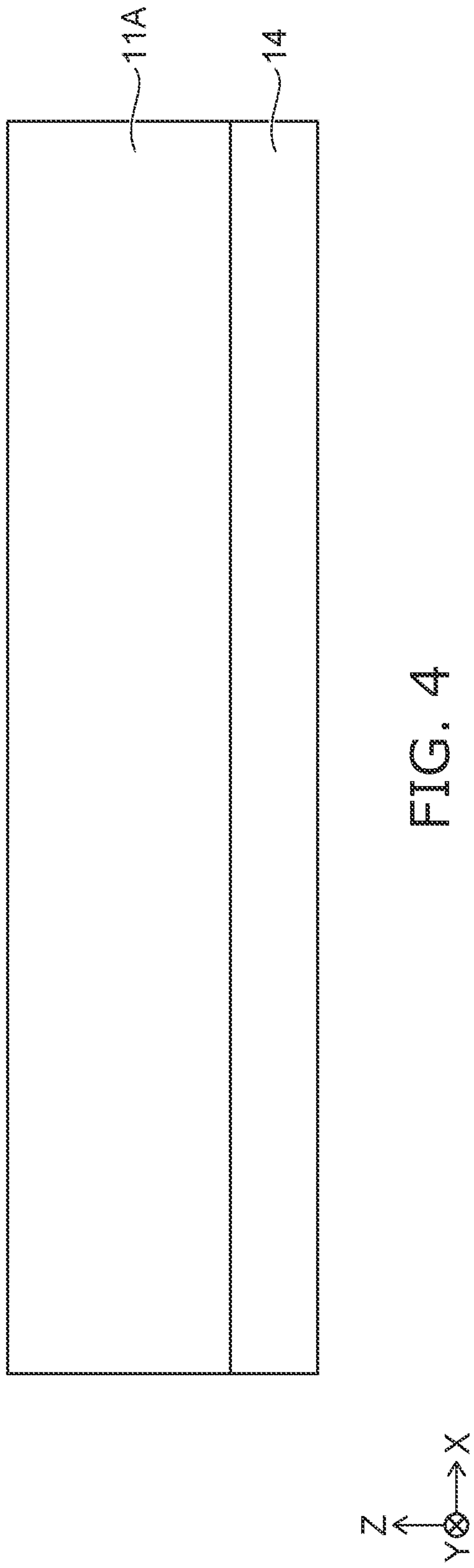

As shown in FIG. 4, an n-type layer 11A is formed on the fourth layer 14 that is prepared as, for example, a SiC substrate. The n-type layer 11A is epitaxially grown on the fourth layer 14 (the SiC substrate).

As shown in FIG. 5, the fifth layer 15, the eighth layer 18, and the sixth layer 16 are formed in the surface of the n-type layer 11A by, for example, implanting a p-type impurity into the surface of the n-type layer 11A by ion implantation. For example, aluminum can be used as the p-type impurity. Also, the twelfth layer 22 is formed by implanting an n-type impurity into the surface of the n-type layer 11A. For example, nitrogen or phosphorus can be used as the n-type impurity.

Figure 6:
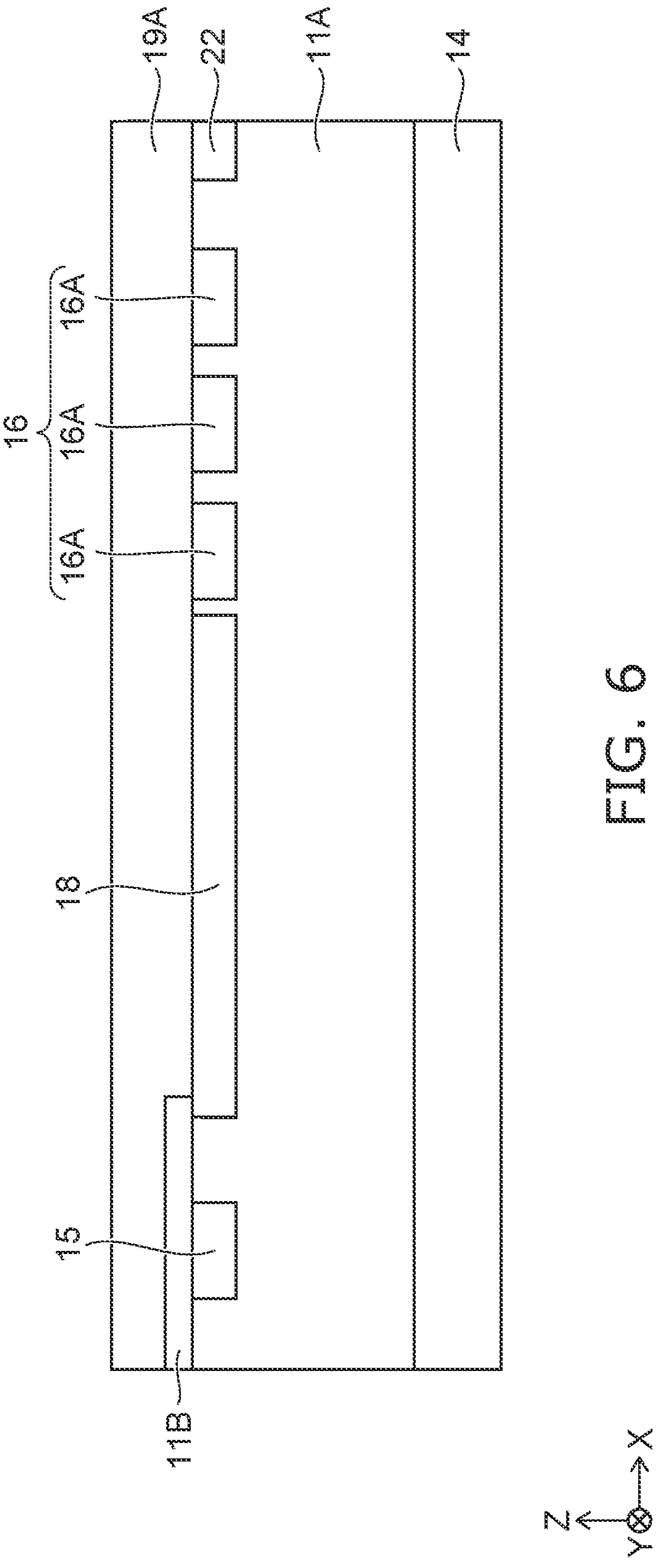

After forming the fifth layer 15, the eighth layer 18, the sixth layer 16, and the twelfth layer 22, an n-type layer 11B and a p-type layer 19A are formed on the surface of the n-type layer 11A as shown in FIG. 6. First, the n-type layer 11B is formed on the entire surface of the n-type layer 11A by epitaxial growth, after which the p-type layer 19A is formed by implanting a p-type impurity into the n-type layer 11B by ion implantation. The implantation depth of the p-type impurity implanted in the active region in which the gate electrode 43 will be located is set to be shallower than the implantation depth of the p-type impurity implanted in the region that is further outward than the active region. The n-type layer 11B remains on the active region. In the region further outward than the active region, the p-type layer 19A contacts the eighth and sixth layers 18 and 16. The thickness of the p-type layer 19A on the n-type layer 11B remaining in the active region is less than the thickness of the p-type layer 19A in the region further outward than the active region. The n-type layer 11A and the n-type layer 11B are included in the first layer 11.

Figure 7:
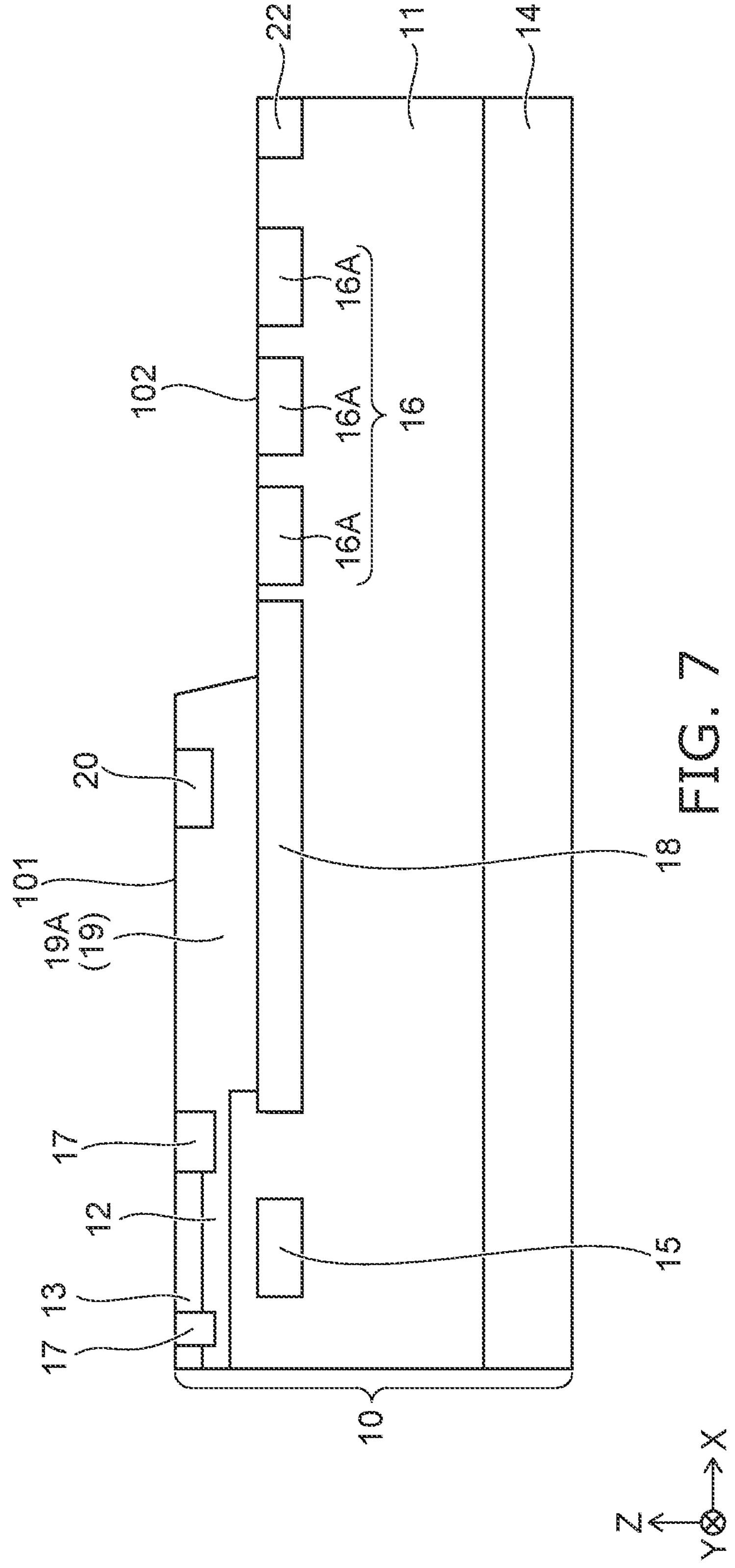

After forming the p-type layer 19A, a portion of the p-type layer 19A is removed to form the first surface 101 and the second surface 102 at the upper surface of the silicon carbide layer 10 as shown in FIG. 7. By removing the portion of the p-type layer 19A, the second surface 102 that is at a position recessed from the first surface 101 is formed. For example, the portion of the p-type layer 19A can be removed by RIE (Reactive Ion Etching). The p-type layer 19A that remains on the eighth layer 18 is used to form the ninth layer 19.

The third layer (the source layer or the emitter layer) 13 is formed in the p-type layer 19A of the active region by implanting an n-type impurity through the first surface 101 by ion implantation. The p-type layer 19A that remains under the third layer 13 becomes the second layer (the base layer) 12. Also, the seventh layer 17 and the tenth layer 20 that have higher p-type impurity concentrations than the p-type layer 19A are formed by implanting a p-type impurity through the first surface 101.

Figure 8:
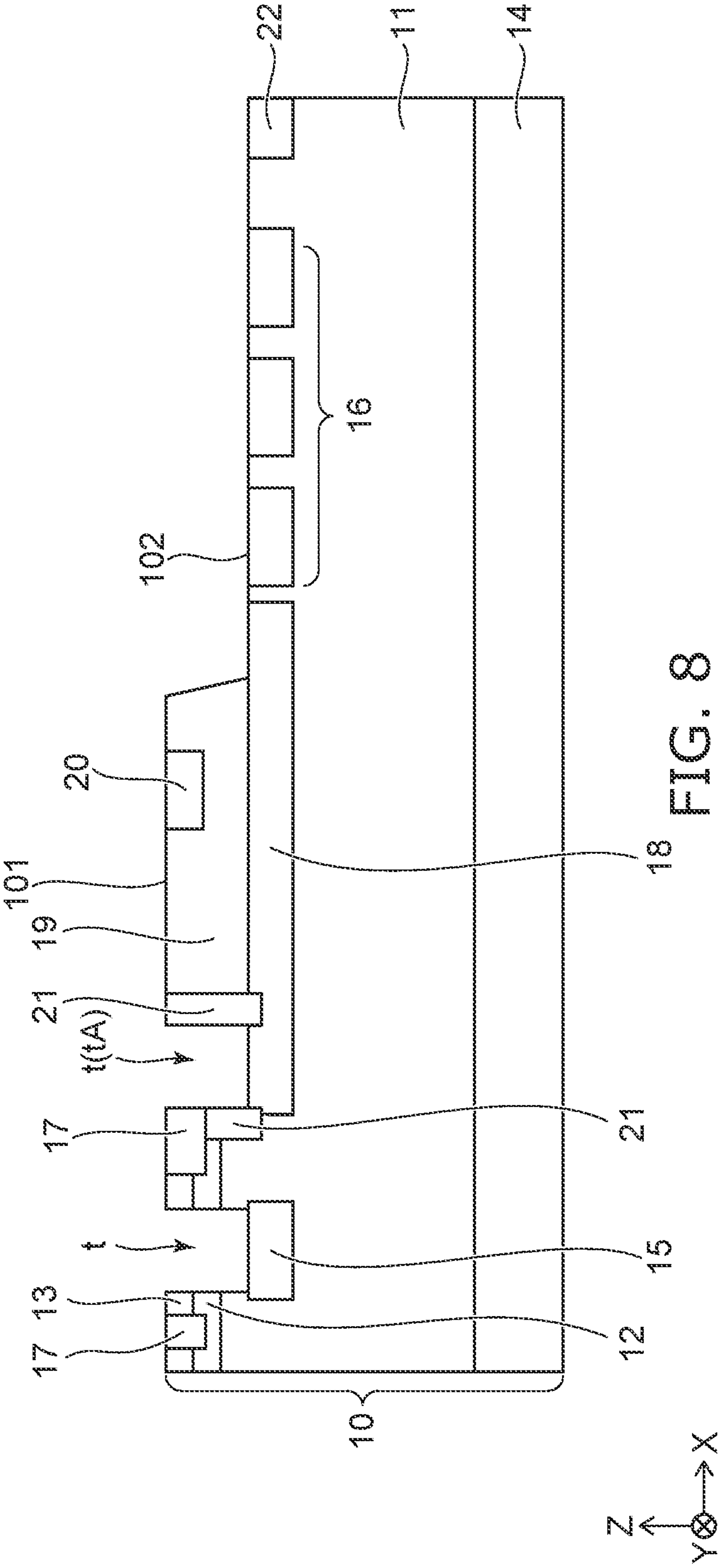

Subsequently, as shown in FIG. 8, multiple trenches t that have openings at the first surface 101 are formed in the silicon carbide layer 10. For example, the trenches t can be formed by RIE. The bottoms of the trenches t reach the fifth layer 15. The bottom of an outermost trench tA that is positioned most outward reaches the eighth layer 18.

After forming the trenches t, the trenches t other than the outermost trench tA are filled with a resist; and ion implantation into the side surface of the outermost trench tA is performed. The p-type eleventh layer 21 that has a higher p-type impurity concentration than the second and ninth layers 12 and 19 is formed by implanting a p-type impurity into a region next to the side surface of the outermost trench tA along a direction oblique to the side surface of the outermost trench tA.

Figure 9:
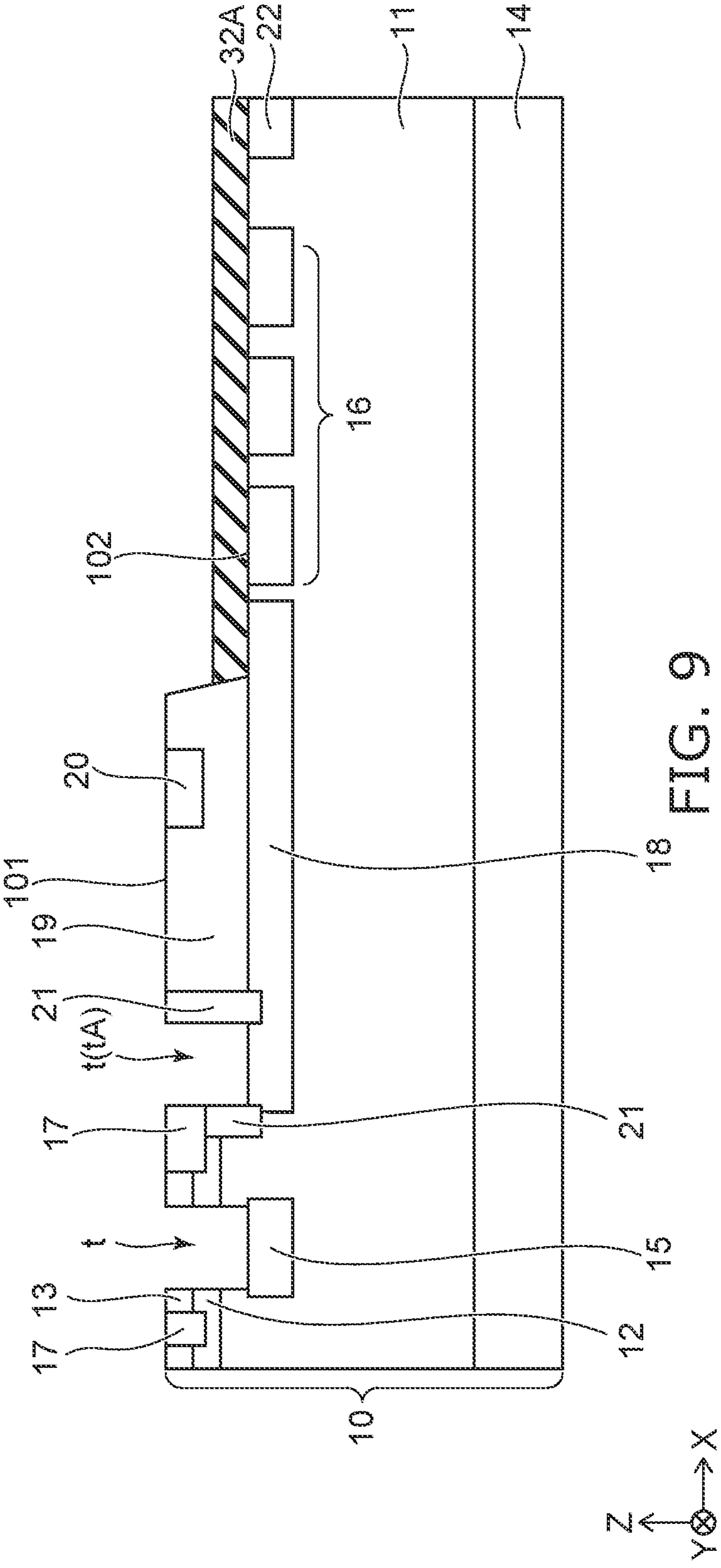

Subsequently, the outermost trench tA also is filled with a resist; and a first layer part 32A that is used to form a portion of the inter-layer insulating film 32 is formed on the entire surface of the first and second surfaces 101 and 102. For example, the first layer part 32A can be formed by CVD (Chemical Vapor Deposition). The first layer part 32A is patterned to remove the first layer part 32A that is on the first surface 101 so that the first layer part 32A that is on the second surface 102 remains as shown in FIG. 9.

Figure 10:
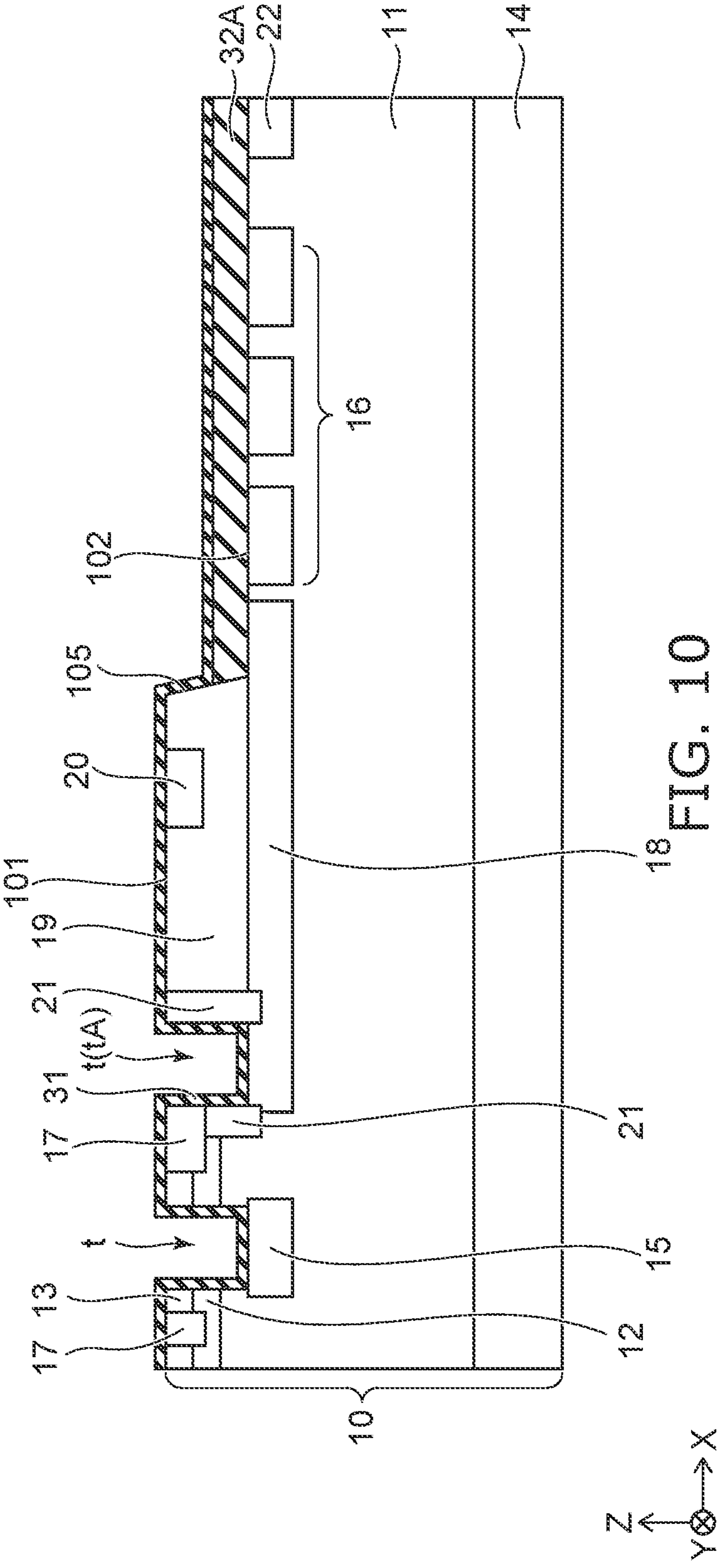

Subsequently, the resist in the trenches t is removed, and the gate insulating film 31 is formed on the side surfaces of the trenches t, the bottom surfaces of the trenches t, the first surface 101, the upper surface of the first layer part 32A, and the interface 105 connecting the first surface 101 and the second surface 102 as shown in FIG. 10. For example, the gate insulating film 31 can be formed by CVD.

Figure 11:
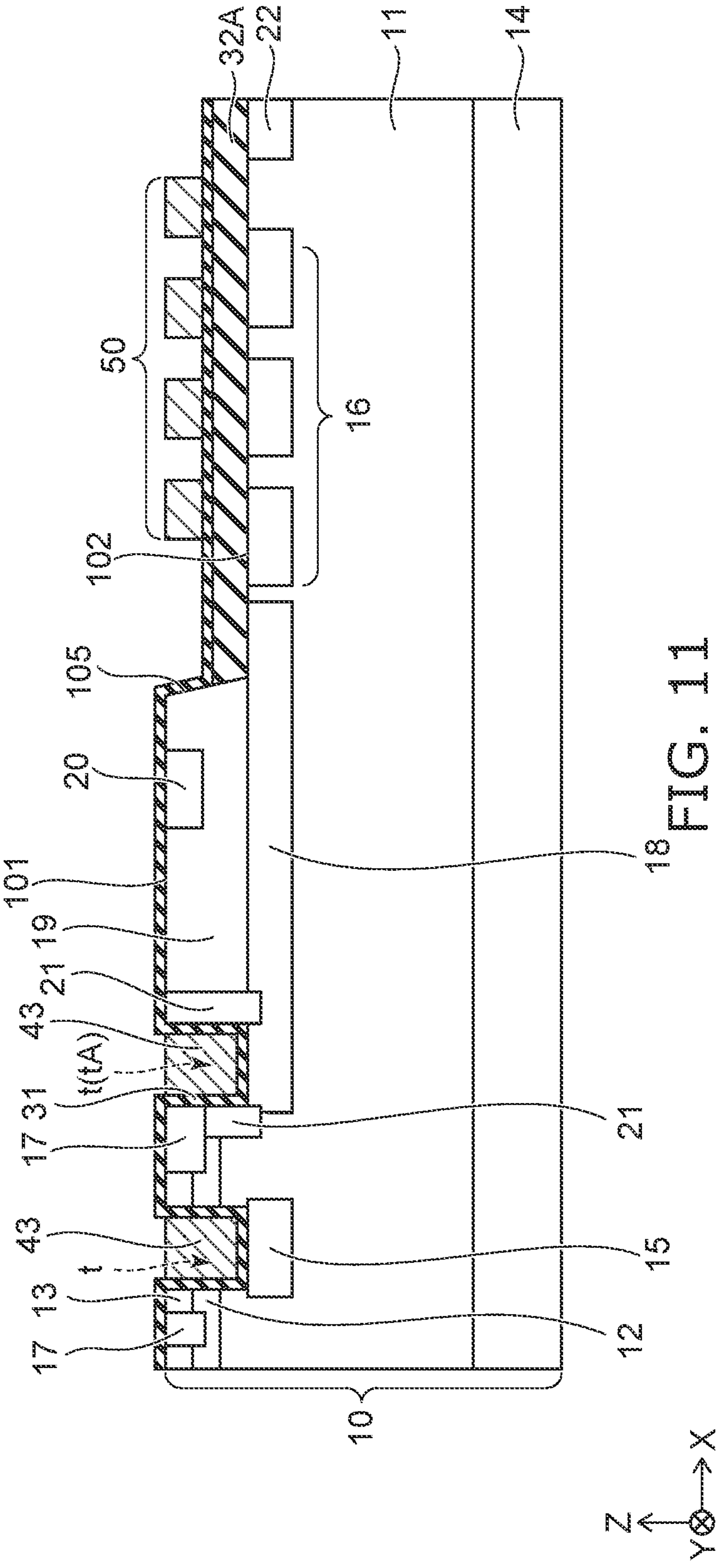

Subsequently, as shown in FIG. 11, the gate electrode 43 and the field plate 50 are formed. For example, a polycrystalline silicon layer is formed by CVD on the gate insulating film 31 to fill the trenches t, after which patterning is performed. After patterning, the polycrystalline silicon layer that remains in the trenches t becomes the gate electrodes 43; and the polycrystalline silicon layer that remains on the first layer part 32A becomes the field plate 50.

In subsequent drawings, the gate insulating film 31 on the first surface 101 and the gate insulating film 31 on the first layer part 32A are not illustrated and are considered to be portions of the inter-layer insulating film 32.

Figure 12:
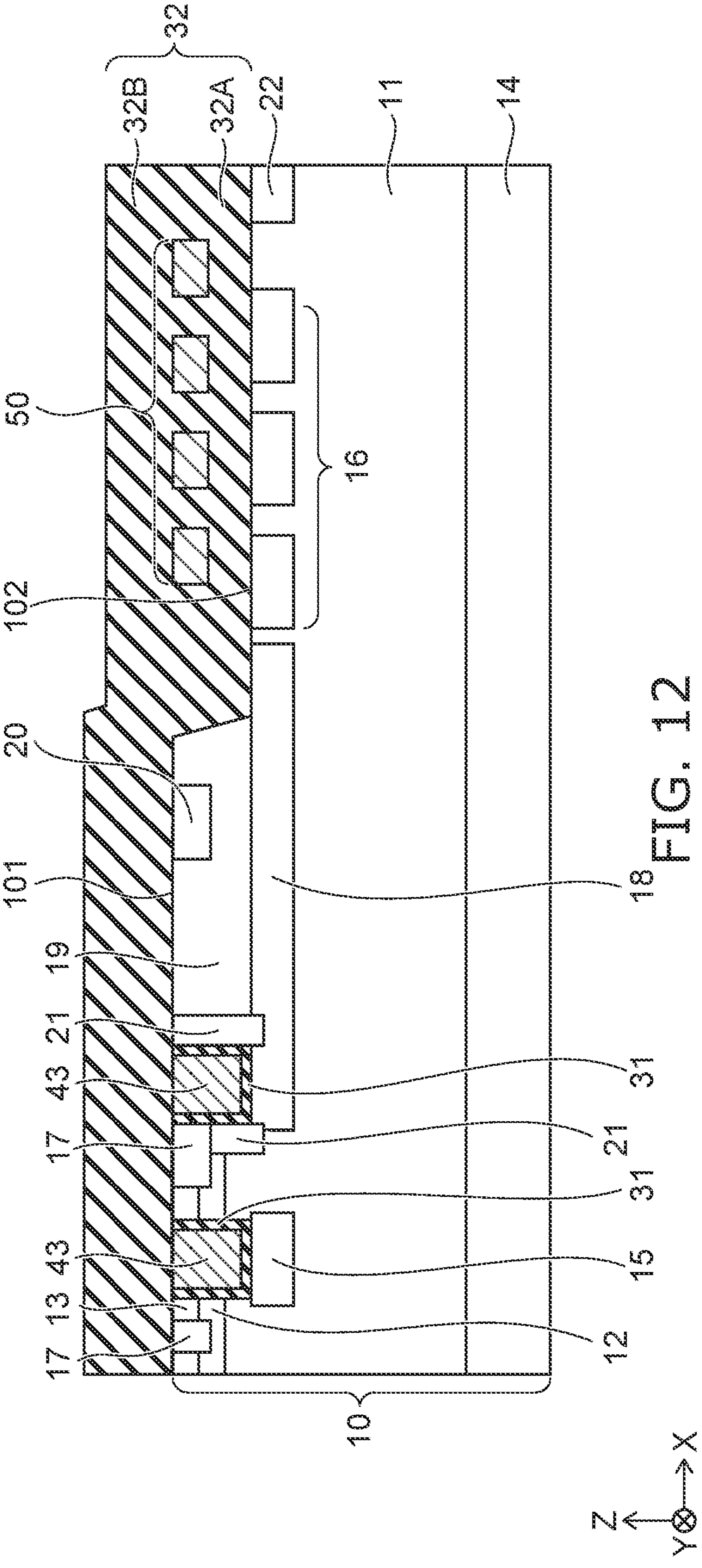

Subsequently, as shown in FIG. 12, a second layer part 32B of the inter-layer insulating film 32 is formed by, for example, CVD on the first surface 101, on the gate electrodes 43, and on the first layer part 32A. The field plate 50 is buried in the inter-layer insulating film 32.

Figure 13:
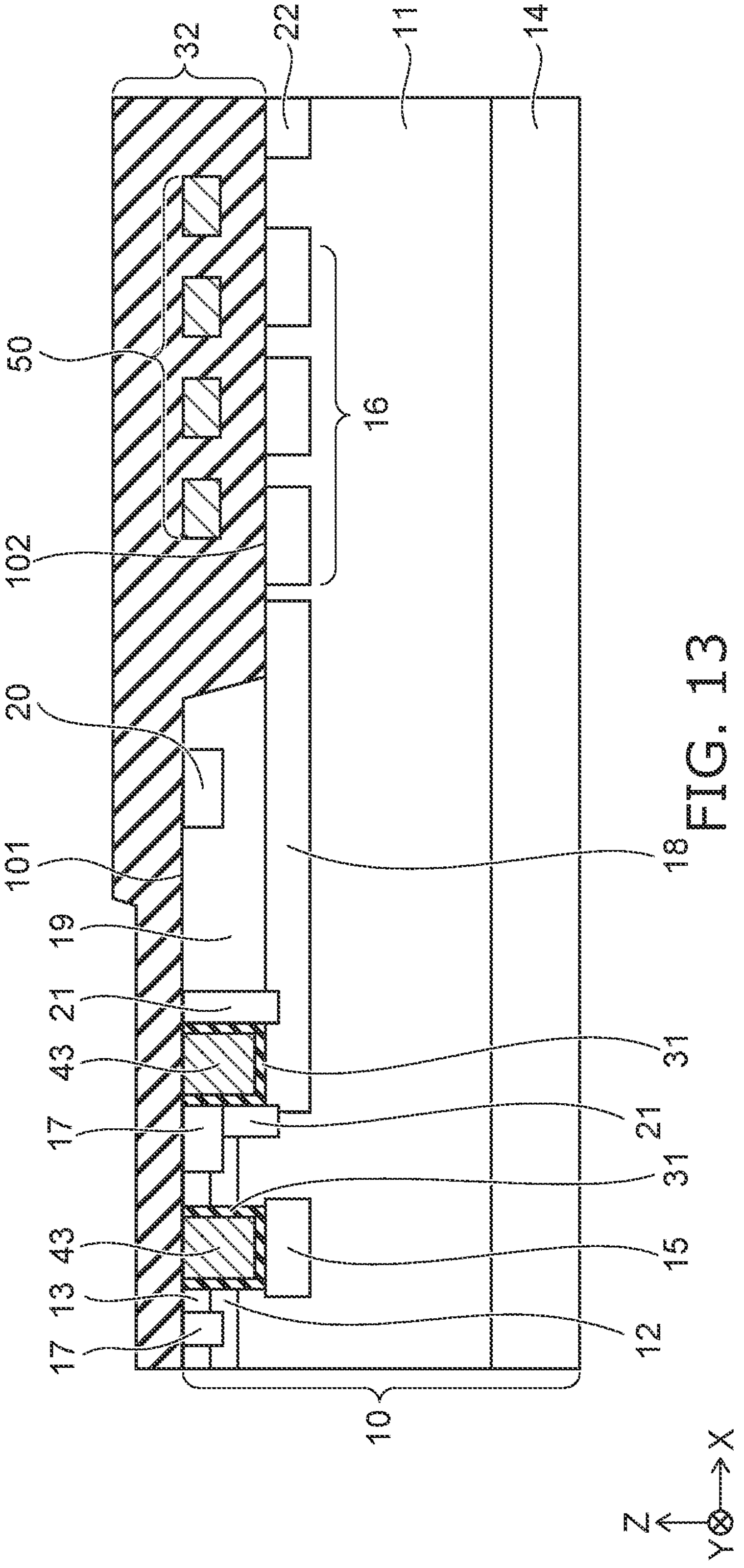

After forming the inter-layer insulating film 32, the inter-layer insulating film 32 is thinned by, for example, RIE in the region in which the first electrode 41 will be formed above the first surface 101 as shown in FIG. 13. The flatness of the upper surface of the semiconductor device 1 after forming the first electrode 41 can be improved thereby.

Figure 14:
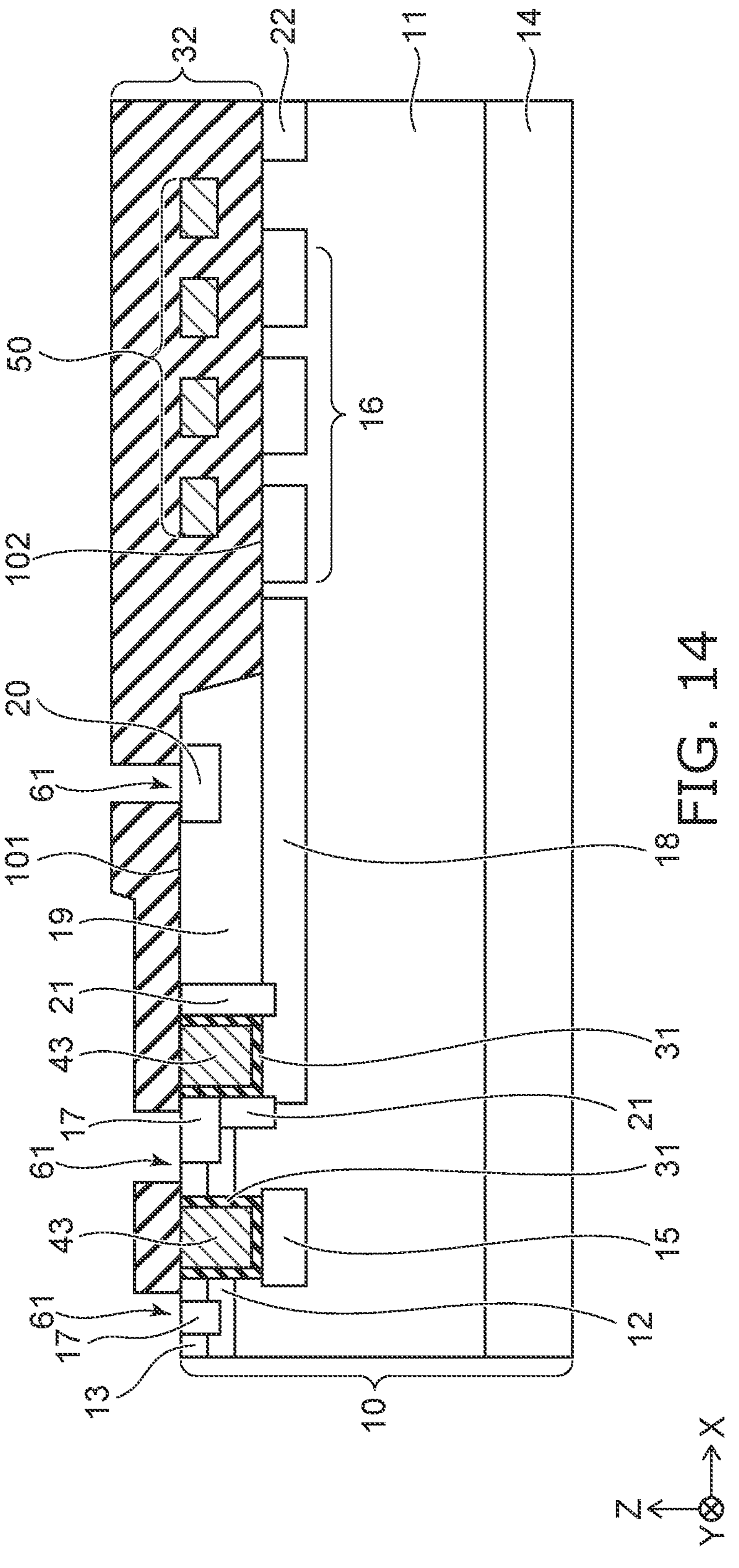

Subsequently, as shown in FIG. 14, multiple openings 61 are formed in the inter-layer insulating film 32. For example, the openings 61 can be formed by RIE using a resist mask. The upper surface of the third layer 13 and the upper surface of the seventh layer 17 are exposed in the openings 61. The upper surface of the tenth layer 20 also is exposed in the opening 61.

As shown in FIG. 2, the first electrode 41 is formed in the openings 61 and on the inter-layer insulating film 32. The second electrode 42 is formed at the back surface of the fourth layer 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:

a silicon carbide layer including a first surface, a second surface, a third surface positioned at a side opposite to the first and second surfaces in a first direction, and a side surface, the second surface being positioned between the first surface and the side surface in a direction orthogonal to the first direction, the second surface being at a position recessed further toward the third surface side than the first surface;

a first electrode located at the first surface;

a second electrode located at the third surface;

a gate electrode located in the silicon carbide layer between the first surface and the third surface;

a gate insulating film located between the gate electrode and the silicon carbide layer;

an inter-layer insulating film located on the second surface, a thickness of the inter-layer insulating film being greater than a difference in heights in the first direction between the first surface and the second surface; and a field plate located in the inter-layer insulating film, the field plate having a lower resistivity than the inter-layer insulating film, the field plate being electrically floating.

2. The device according to claim 1, wherein
the field plate is positioned within a range from the second surface to a height in the first direction of the first surface.

3. The device according to claim 1, wherein
the silicon carbide layer includes:
a first layer provided continuously between the first surface and the third surface and between the second surface and the third surface, the first layer being of a first conductivity type;
a second layer located on the first layer, the second layer facing a side surface of the gate electrode via the gate insulating film, the second layer being of a second conductivity type;
a third layer located on the second layer, the third layer being of the first conductivity type and having a higher first-conductivity-type impurity concentration than the first layer, the third layer being electrically connected with the first electrode;
a fourth layer located between the first layer and the second electrode, the fourth layer being electrically connected with the second electrode; and
a fifth layer positioned under the gate electrode in the first layer, the fifth layer contacting the gate insulating film located at a bottom surface of the gate electrode, the fifth layer being of the second conductivity type.

4. The device according to claim 3, wherein
the silicon carbide layer further includes a sixth layer positioned under the second surface in the first layer,
the sixth layer is positioned at a same height as the fifth layer in the first direction, and
the sixth layer is of the second conductivity type.

5. The device according to claim 4, wherein
the sixth layer includes a plurality of guard ring layers.

6. The device according to claim 4, wherein
the sixth layer has a second-conductivity-type impurity concentration gradient in which a second-conductivity-type impurity concentration of the sixth layer proximate to the side surface is less than the second-conductivity-type impurity concentration of the sixth layer proximate to the gate electrode.

7. A semiconductor device, comprising:
a silicon carbide layer including
a first surface,
a second surface continuously surrounding the first surface,
a third surface positioned at a side opposite to the first and second surfaces in a first direction, and
a side surface, the second surface being positioned between the first surface and the side surface in a direction orthogonal to the first direction, the second surface being at a position recessed further toward the third surface side than the first surface;
a first electrode located at the first surface;
a second electrode located at the third surface;
a gate electrode located in the silicon carbide layer between the first surface and the third surface;
a gate insulating film located between the gate electrode and the silicon carbide layer;
an inter-layer insulating film located on the second surface, a thickness of the inter-layer insulating film being greater than a difference in heights in the first direction between the first surface and the second surface; and
a field plate located in the inter-layer insulating film, the field plate having a lower resistivity than the inter-layer insulating film.

8. The device according to claim 1, wherein
a thickness of the inter-layer insulating film on the second surface is greater than a thickness of the inter-layer insulating film on the first surface.

9. The device according to claim 1, wherein
the inter-layer insulating film covers an interface between the first surface and the second surface.

10. The device according to claim 1, wherein
the field plate is formed in a plurality of ring shapes.

11. The device according to claim 7, wherein
the field plate is electrically floating.

12. A semiconductor device, comprising:
a silicon carbide layer including
a first surface,
a second surface,
a third surface positioned at a side opposite to the first and second surfaces in a first direction, and
a side surface, the second surface being positioned between the first surface and the side surface in a direction orthogonal to the first direction, the second surface being at a position recessed further toward the third surface side than the first surface;
a first electrode located at the first surface;
a second electrode located at the third surface;
a gate electrode located in the silicon carbide layer between the first surface and the third surface;
a gate insulating film located between the gate electrode and the silicon carbide layer;
an inter-layer insulating film located on the second surface, a thickness of the inter-layer insulating film being greater than a difference in heights in the first direction between the first surface and the second surface; and
a field plate located in the inter-layer insulating film, the field plate having a lower resistivity than the inter-layer insulating film, the field plate being electrically connected with the first electrode.

13. The device according to claim 3, wherein
the fifth layer is electrically connected with the first electrode.

14. The device according to claim 3, wherein
a second-conductivity-type impurity concentration of the fifth layer is greater than a second-conductivity-type impurity concentration of the second layer.

15. The device according to claim 4, wherein
a second-conductivity-type impurity concentration of the sixth layer is greater than a second-conductivity-type impurity concentration of the second layer.

16. The device according to claim 4, wherein
the sixth layer is electrically connected with the first electrode.

17. The device according to claim 3, wherein
the silicon carbide layer further includes a field stop layer positioned on the first layer at a corner portion between the second surface and the side surface,
the field stop layer is located in a ring shape along an outer edge of the device,
the field stop layer is of the first conductivity type, and
a first-conductivity-type impurity concentration of the field stop layer is greater than the first-conductivity-type impurity concentration of the first layer.

* * * * *